United States Patent
Hatagi et al.

(10) Patent No.: US 10,349,018 B2
(45) Date of Patent: Jul. 9, 2019

(54) LASER PROJECTION DISPLAY DEVICE

(71) Applicant: Hitachi-LG Data Storage, Inc., Tokyo (JP)

(72) Inventors: Michio Hatagi, Tokyo (JP); Akio Yabe, Tokyo (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 324 days.

(21) Appl. No.: 15/432,005

(22) Filed: Feb. 14, 2017

(65) Prior Publication Data

US 2017/0280115 A1    Sep. 28, 2017

(30) Foreign Application Priority Data

Mar. 25, 2016  (JP) .................................. 2016-061953

(51) Int. Cl.
| | |
|---|---|
| *H04N 9/31* | (2006.01) |
| *G02B 26/10* | (2006.01) |
| *G02B 27/01* | (2006.01) |
| *G02F 1/137* | (2006.01) |
| *G09G 3/34* | (2006.01) |

(Continued)

(52) U.S. Cl.
CPC .......... *H04N 9/3135* (2013.01); *G02B 26/02* (2013.01); *G02B 26/10* (2013.01); *G02B 26/101* (2013.01); *G02B 27/0101* (2013.01); *G02F 1/137* (2013.01); *G09G 3/025* (2013.01); *G09G 3/3406* (2013.01); *G09G 3/36* (2013.01); *H01S 5/005* (2013.01); *H01S 5/0071* (2013.01); *H01S 5/0683* (2013.01); *H01S 5/4012* (2013.01); *H01S 5/4075* (2013.01); *H04N 9/3155* (2013.01); *H04N 9/3161* (2013.01); *H04N 9/3194* (2013.01); *G02B 26/0833* (2013.01); *G02B 2027/0118* (2013.01); *G09G 2320/0626* (2013.01); *G09G 2320/0646* (2013.01);

(Continued)

(58) Field of Classification Search
None
See application file for complete search history.

(56) References Cited

U.S. PATENT DOCUMENTS

| | | | | |
|---|---|---|---|---|
| 9,345,103 | B1 * | 5/2016 | Letourneur | .......... H05B 33/086 |
| 2003/0146919 | A1 * | 8/2003 | Kawashima | .......... G09G 3/3406 |
| | | | | 345/609 |

(Continued)

FOREIGN PATENT DOCUMENTS

| | | |
|---|---|---|
| JP | 2002-104017 A | 4/2002 |
| JP | 2010-072365 A | 4/2010 |

*Primary Examiner* — Joseph R Haley
(74) *Attorney, Agent, or Firm* — Mattingly & Malur, PC

(57) ABSTRACT

A laser projection display device (1) includes a laser source (5), a laser driver (4) that drives the laser source, a scanning unit (7) that scans and projects laser light generated by the laser source, a liquid crystal element (14) that transmits the laser light at a predetermined transmittance, and a liquid crystal driver (17) that changes the transmittance by applying a voltage to the liquid crystal element. When a light quantity of the laser light generated by the laser source corresponds to a case in which the laser source operates in a nonlinear area, the laser driver shifts an operation point to an area other than the nonlinear area by increasing a driving level of the laser source by a predetermined amount G, and the liquid crystal driver decreases the transmittance of the liquid crystal element by a predetermined amount 1/G.

5 Claims, 7 Drawing Sheets

(51) Int. Cl.
G09G 3/36 (2006.01)
H01S 5/00 (2006.01)
H01S 5/0683 (2006.01)
H01S 5/40 (2006.01)
G02B 26/02 (2006.01)
G09G 3/02 (2006.01)
G02B 26/08 (2006.01)

(52) U.S. Cl.
CPC . *G09G 2360/144* (2013.01); *G09G 2360/145* (2013.01); *H01S 5/4093* (2013.01)

(56) References Cited

U.S. PATENT DOCUMENTS

| | | | |
|---|---|---|---|
| 2009/0115720 A1* | 5/2009 | Inada | G09G 3/3426 345/102 |
| 2010/0066925 A1 | 3/2010 | Nagahara et al. | |
| 2012/0169777 A1* | 7/2012 | Budni | G09G 3/02 345/690 |

* cited by examiner

F I G. 2
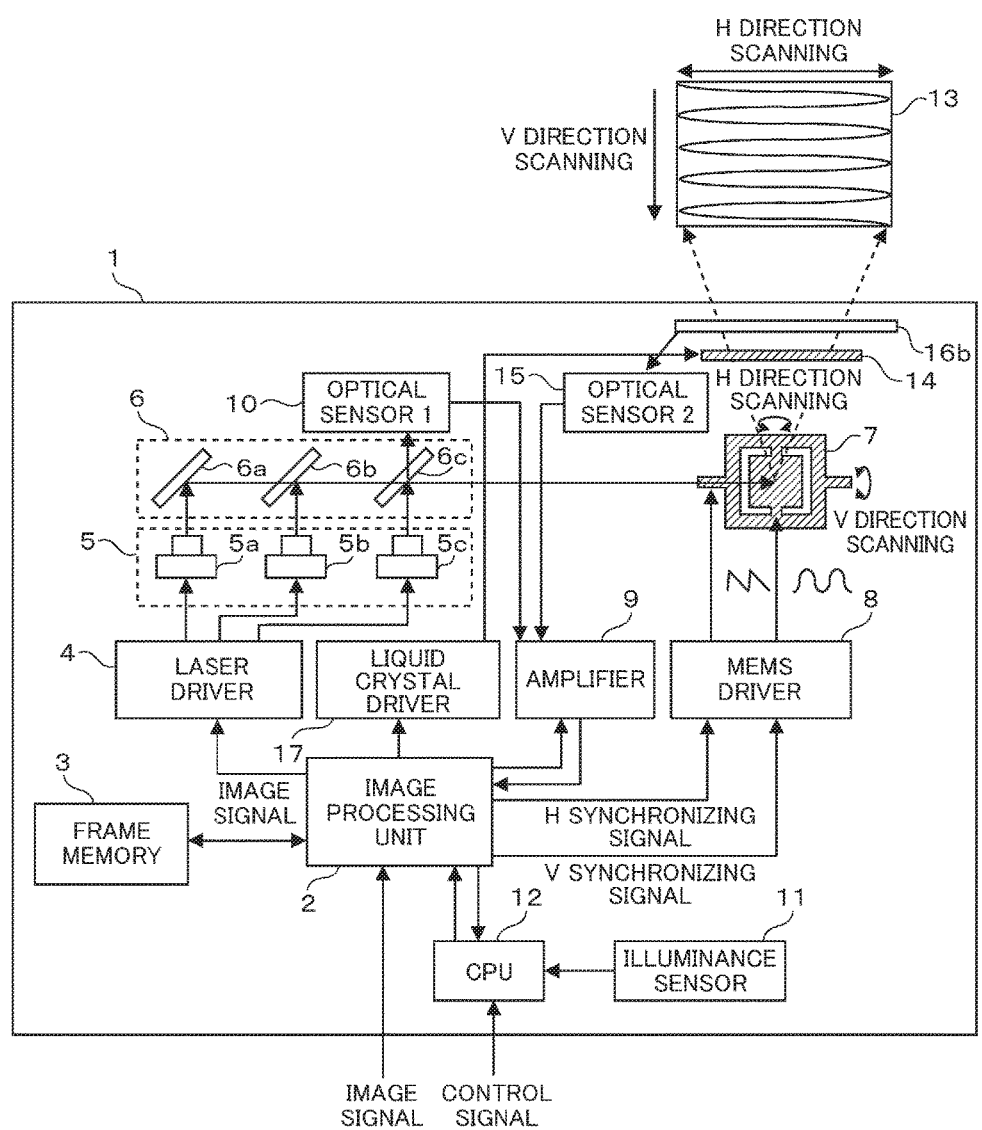

F I G. 4 A
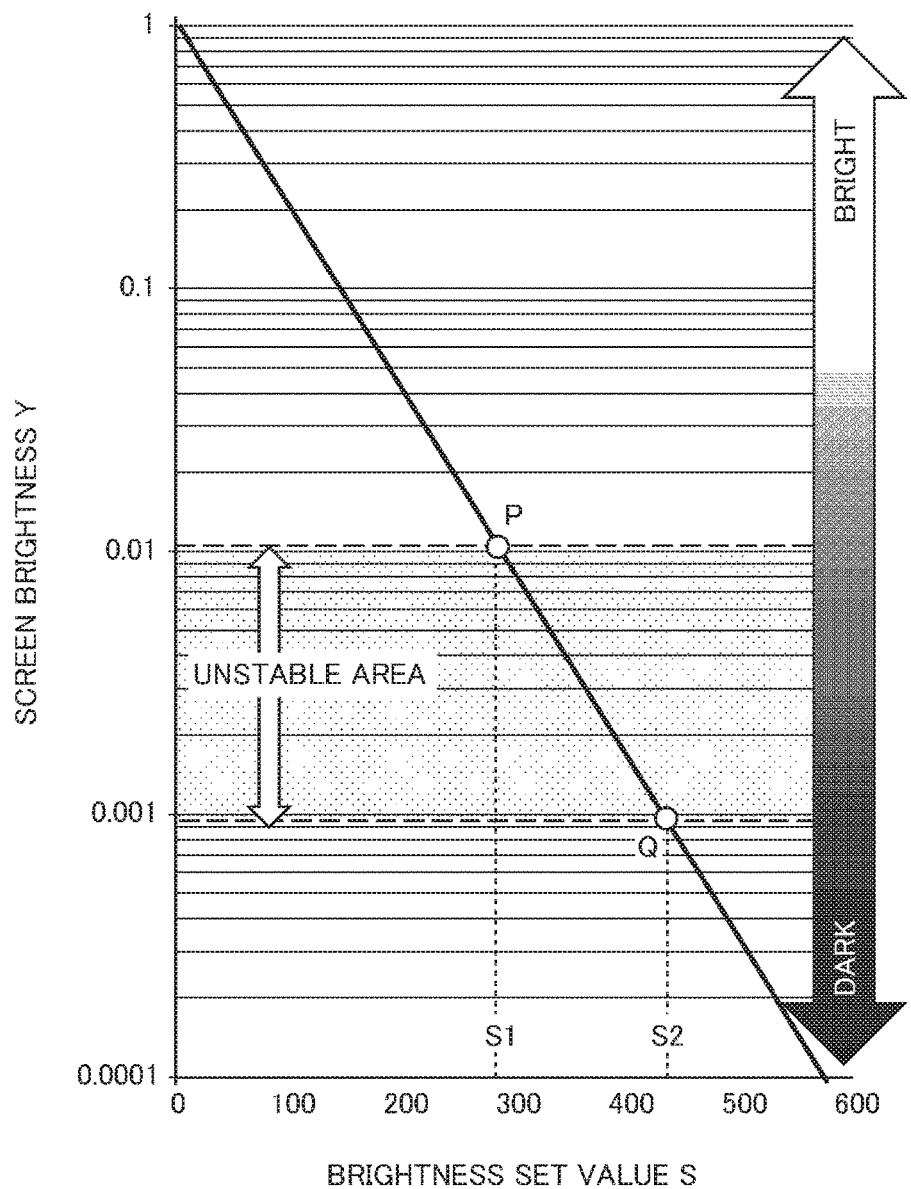

F I G. 6
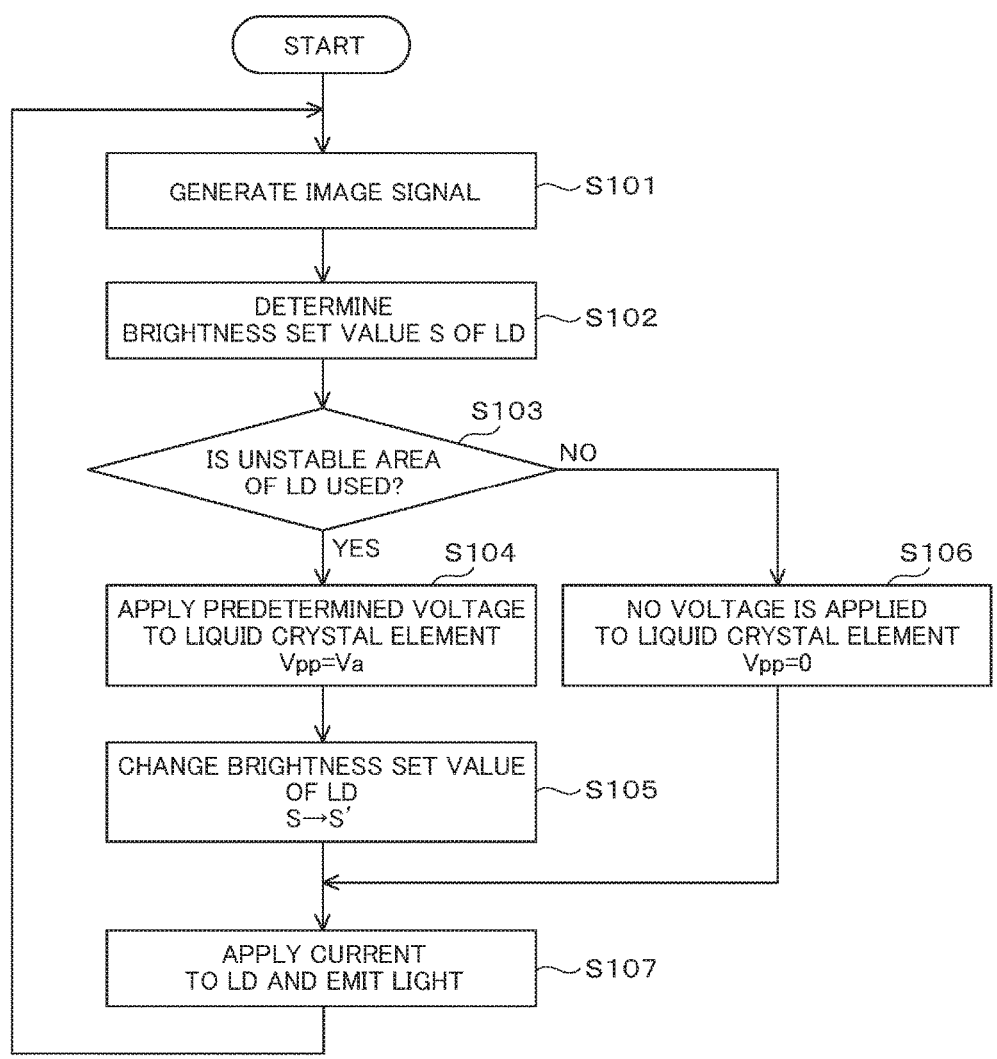

LASER PROJECTION DISPLAY DEVICE

CLAIM OF PRIORITY

The present application claims priority from Japanese patent application serial No. JP 2016-061953, filed on Mar. 25, 2016, the content of which is hereby incorporated by reference into this application.

BACKGROUND OF THE INVENTION (1) Field of the Invention

The present invention relates to a laser projection display device that displays an image by scanning source light of a semiconductor laser, etc. using a two-dimensional (2D) scanning mirror.

(2) Description of the Related Art

Recently, a small projector using a two-dimensional (2D) scanning mirror such as a micro electro mechanical systems (MEMS) mirror and a light source of a semiconductor laser has been put to practical use, and has been used as, for example, a head-up display for supporting driving of a vehicle. In such a laser projection display device, a desired image is projected onto a projection surface by modulating a laser source simultaneously with scanning a 2D scanning mirror in horizontal and vertical directions. Herein, a light modulating mechanism that modulates intensity of projection light according to ambient brightness has been proposed to improve visibility of a projection image.

For example, JP 2010-072365 A describes an on-board head-up display including a combiner that guides information to be displayed to a predetermined position, transmitted light quantity adjusting means that changes quantity of transmitted light of the combiner based on ambient brightness, and brightness detecting means that detects ambient brightness.

In addition, JP 2002-104017 A describes a light modulating mechanism of a head-up display including a screen formed by stacking at least a liquid crystal member and a light transmitting reflection member, and control means that applies a voltage to the liquid crystal member stacked in the screen according to a predetermined instruction signal and adjusts quantity of light penetrating the screen.

SUMMARY OF THE INVENTION

Referring to brightness of a projection image, it is preferable to perform a light modulation operation of changing intensity of projection light according to ambient brightness. For example, in an on-board head-up display, light needs to be delicately modulated according to brightness of an outside of a vehicle. For example, light modulation is maximized when the outside is bright during daytime driving, and light modulation is minimized when the outside is dark during nighttime driving or during driving inside a tunnel. For this reason, a light modulation width becomes an extremely wide range.

Meanwhile, referring to a light-emitting characteristic of a semiconductor laser serving as a light source, light emission intensity does not uniformly change with respect to a driving current, and light quantity steeply increases at a threshold current corresponding to a boundary (nonlinear characteristic). Therefore, when light modulation is performed in a wide range as described above, and an operation is performed across the threshold current, there is a problem that a light emission output (image brightness) is unstable.

A light modulation scheme described in the above patent document decreases intensity of light emitted from the light source based on ambient brightness, etc. However, the nonlinear light-emitting characteristic of the semiconductor laser is not considered, and a phenomenon, in which brightness of the projection image becomes unstable when light is emitted around the threshold current, may not be avoided.

The invention has been conceived in view of the above problem, and an object of the invention is to provide a laser projection display device capable of avoiding an operation of a semiconductor laser in a nonlinear light emission area, and stably modulating brightness of a projection image in a wide range.

To solve the above problem, the invention is a laser projection display device that projects laser light according to an image signal to display an image according to the image signal, including a laser source that generates the laser light, a laser driver that drives the laser source such that laser light is generated at a level according to the image signal, a scanning unit that scans and projects the laser light generated by the laser source according to a synchronizing signal pertaining to the image signal, a liquid crystal element that transmits the laser light generated by the laser source at a predetermined transmittance, a liquid crystal driver that changes the transmittance by applying a voltage to the liquid crystal element, and an image processing unit that generates the image signal, and controls the laser driver and the liquid crystal driver. When a light quantity of the laser light generated by the laser source corresponds to a case in which the laser source operates in a nonlinear area, the image processing unit controls the laser driver such that an operation point is shifted to an area other than the nonlinear area by increasing a driving level of the laser source by a predetermined amount G, and controls the liquid crystal driver such that the transmittance of the liquid crystal element is decreased by a predetermined amount 1/G.

According to the invention, it is possible to provide a laser projection display device that allows a stable light modulation operation at brightness in an extremely wide range by performing an operation while avoiding a nonlinear area in which an operation of a laser source is unstable.

BRIEF DESCRIPTION OF THE DRAWINGS

These and other features, objects and advantages of the present invention will become more apparent from the following description when taken in conjunction with the accompanying drawings wherein:

FIG. 2 is a block diagram illustrating another configuration example of the laser projection display device;

FIG. 4A is a diagram illustrating an example of an operating area of the semiconductor laser;

FIG. 6 is a diagram illustrating a flowchart of a laser projection operation.

DETAILED DESCRIPTION OF THE EMBODIMENT

Hereinafter, an embodiment of the invention will be described in detail using drawings. First, a description will be given of a configuration example of a laser projection display device according to the invention using FIG. 1 and FIG. 2.

Figure 1:
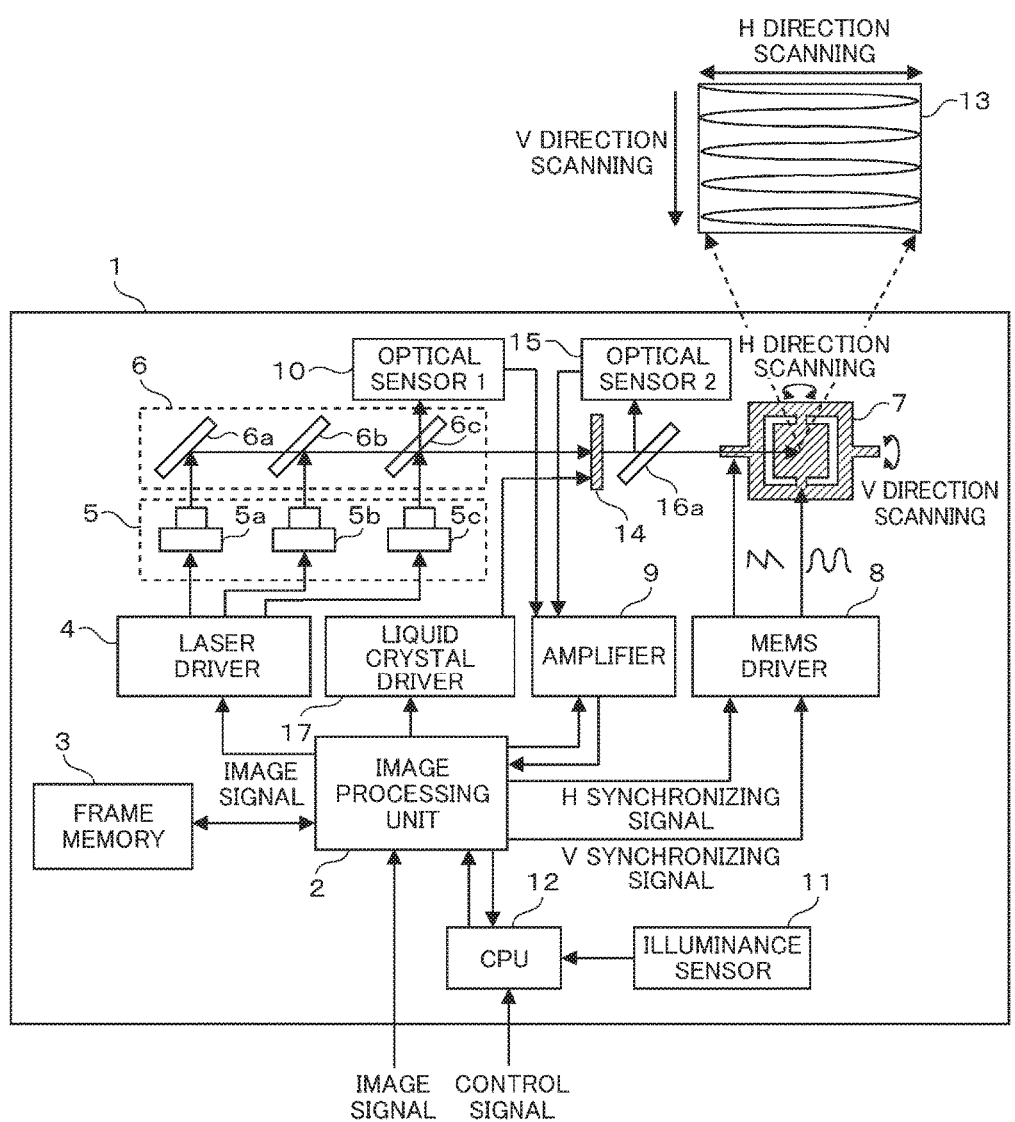
FIG. 1 is a block diagram illustrating a configuration example of a laser projection display device.

FIG. 1 is a block diagram illustrating a configuration example of the laser projection display device. The laser projection display device 1 includes an image processing unit 2, a frame memory 3, a laser driver (laser source driving unit) 4, a laser source 5, a reflecting mirror 6, a micro electro mechanical systems (MEMS) scanning mirror 7, an MEMS driver 8, an amplifier 9, an optical sensor 1 (10), an illuminance sensor 11, a central processing unit (CPU) 12, a liquid crystal element 14, an optical sensor 2 (15), a mirror 16a, and a liquid crystal driver (liquid crystal element driving unit) 17, and displays a display image 13 on a projection surface. Operations of the respective units will be described.

The image processing unit 2 generates an image signal for projection obtained by applying various corrections to an image signal input from an outside, generates a horizontal synchronizing (H synchronizing) signal and a vertical synchronizing (V synchronizing) signal synchronized with the image signal, and supplies the generated signals to the MEMS driver 8. The various corrections performed by the image processing unit 2 include correction of image distortion resulting from scanning of the MEMS scanning mirror 7, gradation adjustment of an image, etc. Image distortion is generated due to a difference at a facing angle between the laser projection display device 1 and the projection surface, an optical axis misalignment of the laser source 5 and the MEMS scanning mirror 7, etc. The generated image signal is temporarily stored in the frame memory 3, read by a read signal synchronized with the horizontal synchronizing signal and the vertical synchronizing signal, and supplied to the laser driver 4.

In addition, the image processing unit 2 controls the laser driver 4 and the liquid crystal driver 17 according to information acquired by the CPU 12 or the amplifier 9, adjusts an output of the laser source 5, and adjusts a transmittance of the liquid crystal element 14. Details thereof will be described below.

The laser driver 4 receives the image signal output from the image processing unit 2, and modulates a driving current to the laser source 5 according to the image signal. For example, the laser source 5 includes three semiconductor lasers (hereinafter abbreviated LD) 5a, 5b, and 5c for three colors (R, G, and B), and emits laser light rays of RGB corresponding to the image signal for respective RGB of the image signal.

Three laser light rays of RGB are combined by the reflecting mirror 6 to irradiate the MEMS scanning mirror 7 by penetrating the liquid crystal element 14. The reflecting mirror 6 includes three dichroic mirrors 6a, 6b, and 6c which reflect a light ray having a certain wavelength and transmit light rays having other wavelengths, and combines the laser light rays of RGB into one laser light ray to supply the combined one laser light ray to the MEMS scanning mirror 7.

The liquid crystal driver 17 receives a control signal output from the image processing unit 2, and applies a predetermined voltage to the liquid crystal element 14. The liquid crystal element 14 changes a molecular orientation according to the applied voltage, and changes the transmission amount of laser light passing therethrough. In other words, the liquid crystal element 14 is used as an element that decreases intensity of laser light. Laser light passing through the liquid crystal element 14 enters the MEMS scanning mirror 7 by passing through the mirror 16a.

The MEMS scanning mirror 7 is an image scanning unit including a two-axis rotation mechanism, and vibrates a mirror portion at a center in two directions of a horizontal direction (H direction) and a vertical direction (V direction). The MEMS driver 8 generates a sine wave in synchronization with the horizontal synchronizing signal from the image processing unit 2, and generates a saw tooth wave synchronized with the vertical synchronizing signal, thereby controlling driving of the MEMS scanning mirror 7. In this way, laser light is scanned on a track illustrated in display image 13 of FIG. 1, and an input image may be optically projected when scanning is synchronized with a modulation operation by the laser driver 4.

The optical sensor 1 (10) measures light quantity of laser light emitted from the laser source 5. In more detail, several % of leak light (reflected light and transmitted light) of laser light in the reflecting mirror 6c is detected and output to the amplifier 9. Meanwhile, the optical sensor 2 (15) measures light quantity of laser light passing through the liquid crystal element 14. In more detail, several % of leak light (reflected light) of laser light in the mirror 16a is detected and output to the amplifier 9. The amplifier 9 amplifies outputs of the optical sensor 1 (10) and the optical sensor 2 (15), and outputs the amplified outputs to the image processing unit 2.

The image processing unit 2 compares a detection output of the optical sensor 1 (10) with a luminance level of an input image signal, and controls the laser driver 4 such that a desired level is obtained. In addition, the image processing unit 2 calculates the transmittance of the liquid crystal element 14 from a difference in detection output between the optical sensor 1 (10) and the optical sensor 2 (15). Then, the liquid crystal driver 17 is controlled such that the transmittance of the liquid crystal element 14 becomes a desired value. In this instance, as described below, when light quantity of laser light emitted from the laser source 5 is in a particular range (a nonlinear area in which an operation of the laser source 5 is unstable as described below), the image processing unit 2 controls the laser driver 4 such that an operation point is shifted to an area other than the nonlinear area by increasing a driving level with respect to the laser source 5 by predetermined gain, and controls the liquid crystal driver 17 such that the transmittance of the liquid crystal element 14 is decreased by a predetermined amount.

The illuminance sensor 11 detects illuminance around the laser projection display device 1 and outputs the detected illuminance to the CPU 12. The CPU 12 receives a signal from the illuminance sensor 11 or a control signal from the outside, and supplies a light modulation request signal for controlling brightness of the display image 13 generated by the image processing unit 2 to the image processing unit 2.

As described above, the laser projection display device 1 of the present embodiment uses the liquid crystal element 14 as a laser light decreasing element, thereby performing an operation while avoiding the nonlinear area in which an operation of the laser source 5 is unstable. In this instance, a liquid crystal element corresponding to a non-mechanical component is employed as the laser light decreasing element, and thus the laser projection display device 1 is reliable and suitable for, for example, the on-board head-up display, etc.

FIG. 2 is a block diagram illustrating another configuration example of the laser projection display device. A difference from the configuration of FIG. 1 is disposition of the liquid crystal element 14. In more detail, in an example of FIG. 2, the liquid crystal element 14 is disposed at an emission side of the MEMS scanning mirror 7. In addition, a glass plate 16b is disposed at an emission side of the liquid crystal element 14, thereby reflecting a portion of laser light passing through the liquid crystal element 14 and detecting the reflected portion using the optical sensor 2 (15).

In the configuration of FIG. 2, when the liquid crystal element 14 is used as the laser light decreasing element, an operation may be performed while avoiding the area in which an operation of the laser source 5 is unstable.

The configurations of FIG. 1 and FIG. 2 are compared. In the configuration in which the liquid crystal element 14 is disposed at an incident side of the MEMS scanning mirror 7 as illustrated in FIG. 1, an incidence angle of laser light with respect to the liquid crystal element 14 is fixed, and thus there is a merit in that the transmittance inside the liquid crystal element 14 is uniform, and brightness of the display image 13 is uniform inside the screen. Meanwhile, in the configuration in which the liquid crystal element 14 is disposed at the emission side of the MEMS scanning mirror 7 as illustrated in FIG. 2, laser light is scanned and made incident on the liquid crystal element 14, and thus there is a merit in that damage to the liquid crystal element 14 is small. Therefore, the configuration of FIG. 1 or FIG. 2 may be selected in consideration of a usage pattern of the laser projection display device.

Figure 3:
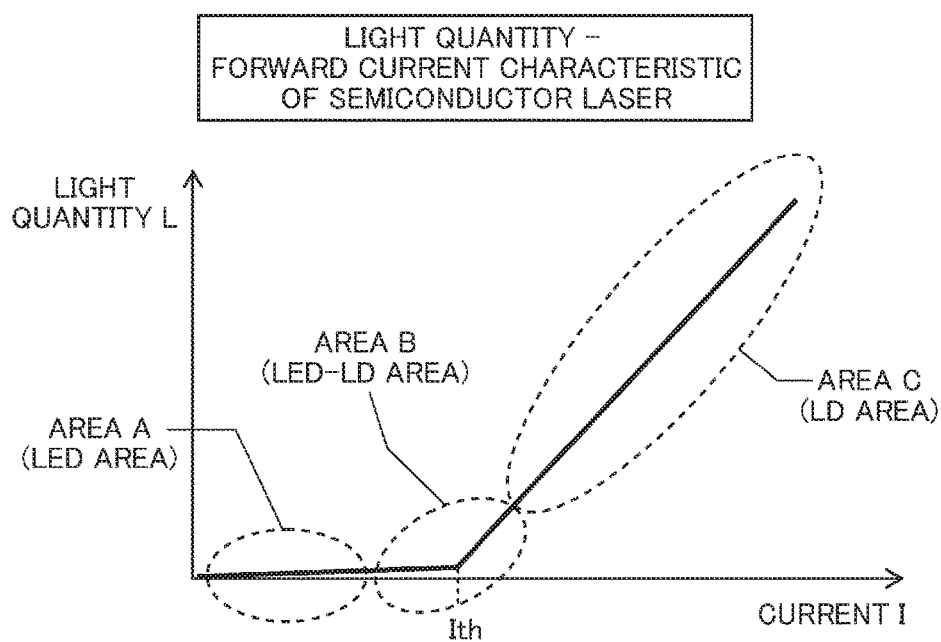
FIG. 3 is a diagram illustrating an example of a light quantity-forward current characteristic of a semiconductor laser.

FIG. 3 is a diagram illustrating an example of a light quantity-forward current characteristic of the semiconductor laser. A current I is indicated in a horizontal axis, and a light quantity L is indicated in a vertical axis. However, the semiconductor laser has a nonlinear characteristic in which the light quantity L steeply increases at a certain threshold current Ith corresponding to a boundary. When the diagram is divided into operating areas, an area A is an area used at a smaller current than the threshold current Ith and also referred to as an "LED area", an area C is an area used at a larger current than the threshold current Ith and also referred to as an "LD area", and an area B interposed therebetween is an area used across the threshold current Ith and also referred to as an "LED-LD area".

For example, it is presumed that the laser projection display device of the present embodiment is applied as the on-board head-up display. In this case, light needs to be delicately modulated according to brightness of an outside of a vehicle. For example, light modulation is maximized when the outside is bright during daytime driving, and light modulation is minimized when the outside is dark during nighttime driving or during driving inside a tunnel. For this reason, it is presumed that a dynamic range of output light quantity L is wide, and an operation is performed across all the areas A, B, and C.

In other words, a range of a current flowing to the semiconductor laser when a bright image is formed corresponds to the area C, and a range of a current flowing to the semiconductor laser when a dark image is formed corresponds to the area A. In addition, in the case of intermediate brightness, a range of a current flowing to the semiconductor laser corresponds to the area B.

In the case of use in the area B, an output coefficient of light quantity with respect to an input current greatly varies at the threshold current Ith serving as a boundary, and thus there is difficulty in linearly changing brightness. As a result, light modulation performance may be unstable, color balance (while balance) of RGB may be lost, and thus coloring performance may deteriorate. The area B across the threshold current Ith at which light modulation performance is unstable as described above is referred to as "a nonlinear area or an unstable area".

In the present embodiment, light modulation is performed using the liquid crystal element 14, transmittance of which changes according to an applied voltage, in the unstable area corresponding to the area B. In more detail, desired brightness is linearly implemented in the area B when the semiconductor laser is shifted to the high brightness area C, in which a linear operation is allowed, and operated, and a light decreasing action by the liquid crystal element 14 is used.

Figure 4B:
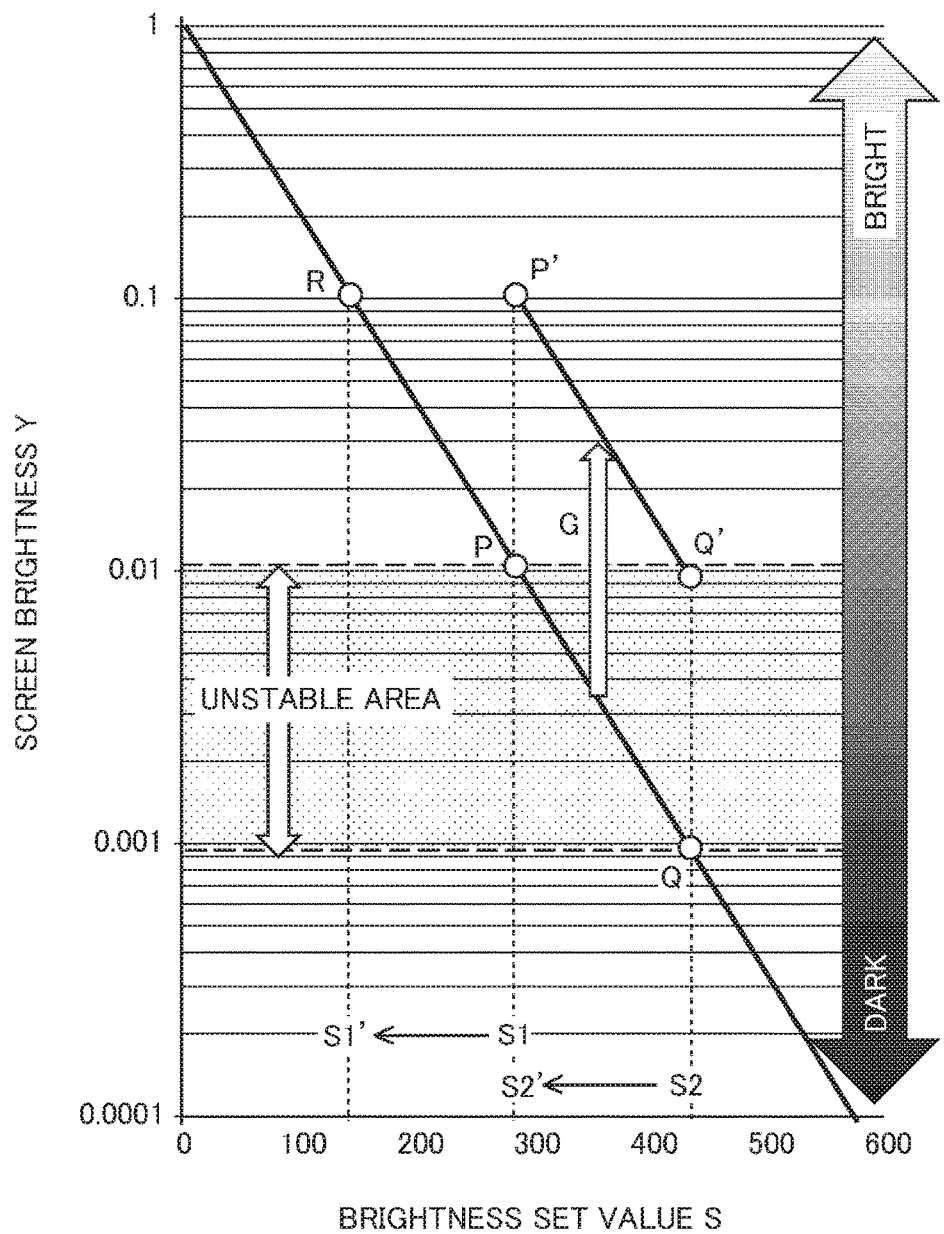
FIG. 4B is a diagram for description of switching of operating areas of the semiconductor laser.

Next, a description will be given of switching of the operating areas of the semiconductor laser using the liquid crystal element 14. FIG. 4A and FIG. 4B are diagrams illustrating examples of an operating area of the semiconductor laser. FIG. 4A corresponds to a case in which switching of operations is not present, and FIG. 4B corresponds to a case in which switching of operations is present.

In FIG. 4A, a vertical axis indicates screen brightness Y (relative value) in a logarithmic scale, and a horizontal axis indicates a brightness set value S (step value) with respect to the screen brightness Y. The screen brightness Y becomes a maximum value=1 (relative value) when the brightness set value S equals 0, and the screen brightness Y becomes a minimum value=0.0001 when the brightness set value S equals 600. In this case, it is presumed that a dynamic range of the screen brightness Y corresponds to 10,000 times. In the range, for example, a range of the brightness Y of 0.01 to 0.001 (between symbols P and Q) is set to the unstable area (nonlinear area). This unstable area corresponds to the area B (LED-LD area) described in FIG. 3, and the brightness Y does not linearly correspond to the set value S in an interval of the set value S (S1 to S2).

FIG. 4B is a diagram for description of switching of operating areas for avoiding the unstable area of FIG. 4A. In the unstable area (between P and Q), an operation level of the semiconductor laser is shifted upward in the vertical axis (direction in which brightness increases), and operating areas are switched such that an operation is performed in a range of the brightness Y=0.1 to 0.01 (between symbols P' and Q'). For this reason, in this example, gain G of the brightness is increased by 10 times. In other words, with regard to the brightness set value S in the horizontal axis, the unstable operation interval S1 to S2 is shifted to an interval of S1' to S2', and an operation range of the semiconductor laser is shifted to an interval of symbols R to P. Meanwhile, in response to switching of operation levels of the semiconductor laser, transmittance of the liquid crystal element is decreased by 1/G, that is, 1/10 times. As a result, it is possible to achieve a desired value (0.01 to 0.001) as intensity of laser light emitted from the liquid crystal element, that is, the screen brightness Y. Such switching of operating areas allows an operation while avoiding the unstable area of the semiconductor laser.

Figure 5:
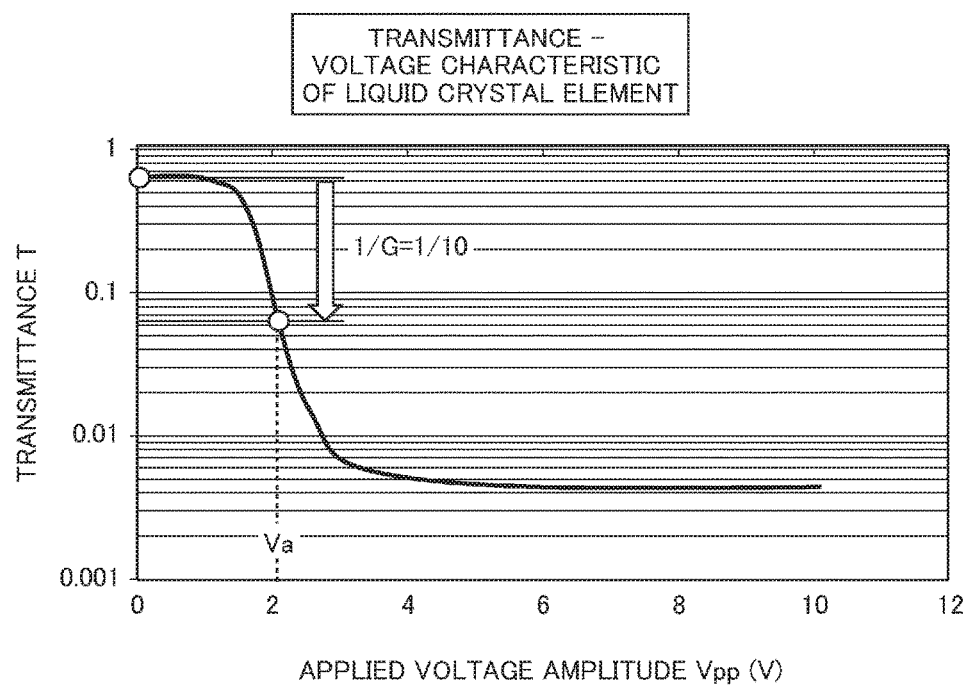
FIG. 5 is a diagram illustrating an example of a transmittance-voltage characteristic of a liquid crystal element.

FIG. 5 is a diagram illustrating an example of a transmittance-voltage characteristic of the liquid crystal element. A horizontal axis indicates applied voltage amplitude Vpp (alternating current (AC) rectangular wave), and a vertical axis indicates transmittance T. In this example, the transmittance T is about 0.6 when the applied voltage Vpp is 0, and thus this value is used as a reference value. For example, an applied voltage Va is set to about 2 V in order to decrease the transmittance T to 0.06 (1/10 times). A voltage other than 0 may be applied to the liquid crystal element at all times, and the transmittance T may be decreased by a predetermined amount.

FIG. 6 is a diagram illustrating a flowchart of a laser projection operation. The image processing unit 2 executes processing below for each frame of an image signal. A processing unit may be changed according to a type/image quality of a displayed image. Hereinafter, a description will be given in order of step.

In S101, the image processing unit 2 generates an image signal for projection obtained by applying various corrections to an input image signal. In S102, the image processing unit 2 determines a "brightness set value S" (horizontal axis of FIG. 4B) for driving the semiconductor laser (LD) based on the generated image signal.

In S103, whether the "brightness set value S" uses the unstable area (interval of S1 to S2 of FIG. 4B) of the semiconductor laser is determined. The operation proceeds to S104 when the unstable area is used, and proceeds to S106 when the unstable area is not used.

In S104, the liquid crystal driver 17 is controlled, and a predetermined voltage (Va illustrated in FIG. 5) is applied to the liquid crystal element 14 to decrease transmittance. In S105, the brightness set value S of the semiconductor laser is changed with respect to the laser driver 4. Specifically, the set value is shifted to a corresponding position in the interval of S1' to S2' as in FIG. 4B.

In S106, the liquid crystal driver 17 is controlled, and a voltage Vpp applied to the liquid crystal element 14 is set to 0.

In S107, a current is applied to the semiconductor laser from the laser driver 4, and light is emitted from the laser source 5. In this way, the image signal is projected and displayed. Thereafter, the operation return to S101, and the same processing is repeated with respect to a subsequent image signal.

As described in the foregoing, the laser projection display device of the present embodiment uses the liquid crystal element as the laser light decreasing element, thereby performing an operation while avoiding the nonlinear area in which an operation of the laser source 5 is unstable. In this way, a stable light modulation operation may be performed at brightness in an extremely wide range. In this instance, since the liquid crystal element corresponding to a non-mechanical component is employed as the laser light decreasing element, it is possible to implement a highly reliable laser projection display device.

What is claimed is:

1. A laser projection display device that projects laser light according to an image signal to display an image according to the image signal, the laser projection display device comprising:
    a laser source that generates the laser light;
    a laser driver that drives the laser source such that laser light is generated at a level according to the image signal;
    a scanning unit that scans and projects the laser light generated by the laser source according to a synchronizing signal pertaining to the image signal;
    a liquid crystal element that transmits the laser light generated by the laser source at a predetermined transmittance;
    a liquid crystal driver that changes the transmittance by applying a voltage to the liquid crystal element; and
    an image processing unit that generates the image signal, and controls the laser driver and the liquid crystal driver,
    wherein, when a light quantity of the laser light generated by the laser source corresponds to a case in which the laser source operates in a nonlinear area, the image processing unit controls the laser driver such that an operation point is shifted to an area other than the nonlinear area by increasing a driving level of the laser source by a predetermined amount G, and controls the liquid crystal driver such that the transmittance of the liquid crystal element is decreased by a predetermined amount 1/G.

2. The laser projection display device according to claim 1,
    wherein the laser source is a semiconductor laser, and
    the nonlinear area of the laser source is an area across a threshold current at which a light quantity of the semiconductor laser steeply increases.

3. The laser projection display device according to claim 1, further comprising
    a first optical sensor and a second optical sensor that detect intensities of the laser light at an incident side and an emission side with respect to the liquid crystal element, respectively,
    wherein the image processing unit calculates the transmittance of the liquid crystal element using an output difference between the first optical sensor and the second optical sensor, and controls the liquid crystal driver.

4. The laser projection display device according to claim 1, wherein the liquid crystal element is disposed at an incident side of the laser light with respect to the scanning unit.

5. The laser projection display device according to claim 1, wherein the liquid crystal element is disposed at an emission side of the laser light with respect to the scanning unit.

* * * * *